(12) United States Patent  (10) Patent No.: US 8,872,344 B2
Mair  (45) Date of Patent: Oct. 28, 2014

(54) CONDUCTIVE VIA STRUCTURES FOR ROUTING POROSITY AND LOW VIA RESISTANCE, AND PROCESSES OF MAKING

(75) Inventor: Hugh Thomas Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 489 days.

(21) Appl. No.: 13/101,760

(22) Filed: May 5, 2011

(65) Prior Publication Data

US 2011/0304994 A1 Dec. 15, 2011

Related U.S. Application Data

(60) Provisional application No. 61/352,951, filed on Jun. 9, 2010.

(51) Int. Cl.
*H01L 23/48* (2006.01)
*H01L 23/52* (2006.01)
*H01L 29/40* (2006.01)
*H01L 23/528* (2006.01)
*H01L 23/522* (2006.01)
*H01L 21/768* (2006.01)

(52) U.S. Cl.
CPC ............. *H01L 23/528* (2013.01); *H01L 21/768* (2013.01); *H01L 23/5226* (2013.01); *H01L 2924/12044* (2013.01)
USPC ............ 257/773; 257/774; 257/775; 257/758

(58) Field of Classification Search
CPC .. H01L 23/5226; H01L 21/768; H01L 23/528
USPC .................... 257/758, 774, 775, 773
See application file for complete search history.

(56) References Cited

U.S. PATENT DOCUMENTS

| | | | |
|---|---|---|---|
| 4,978,634 A * | 12/1990 | Shen et al. ..................... | 438/244 |
| 6,188,095 B1 * | 2/2001 | Hieke ............................ | 257/296 |
| 7,215,563 B2 * | 5/2007 | Brandon et al. ................ | 365/94 |
| 7,601,624 B2 | 10/2009 | Rothenbury et al. | |
| 2003/0214863 A1 * | 11/2003 | Lebourg et al. ............... | 365/200 |
| 2004/0141352 A1 * | 7/2004 | Dufourt et al. .................. | 365/72 |
| 2004/0168138 A1 | 8/2004 | Neal et al. | |
| 2006/0076547 A1 | 4/2006 | Lin et al. | |
| 2006/0095883 A1 | 5/2006 | Lakshmanan et al. | |
| 2006/0220760 A1 * | 10/2006 | Floyd et al. ..................... | 333/26 |
| 2008/0034332 A1 | 2/2008 | Anikin et al. | |
| 2008/0246032 A1 * | 10/2008 | Zhu et al. ........................ | 257/48 |
| 2008/0277794 A1 | 11/2008 | Uchikoshi et al. | |
| 2009/0168843 A1 | 7/2009 | Waters et al. | |
| 2010/0181683 A1 | 7/2010 | Jha et al. | |
| 2010/0297825 A1 * | 11/2010 | Chinthakindi et al. ....... | 438/393 |
| 2011/0042826 A1 * | 2/2011 | Gambino et al. ............. | 257/774 |

* cited by examiner

*Primary Examiner* — Nicholas Tobergte
(74) *Attorney, Agent, or Firm* — Jacqueline J. Garner; Frederick J. Telecky, Jr.

(57) ABSTRACT

An integrated circuit structure includes a first conductive layer (MET4) including a first forked conductive structure (310), an insulating layer (320, ILD45) substantially disposed over the first forked conductive structure (310), a plurality of conductive vias (331-334) through the insulating layer (ILD45) and electrically connecting with the first forked conductive structure (310), and a second conductive layer (MET5) including a second forked conductive structure (340) substantially disposed over at least a portion of the insulating layer (ILD45) and generally perpendicular to the first forked conductive structure (310), the plurality of conductive vias (331-334) electrically connecting with the second forked conductive structure (340). Other structures, devices, and processes are also disclosed.

23 Claims, 14 Drawing Sheets

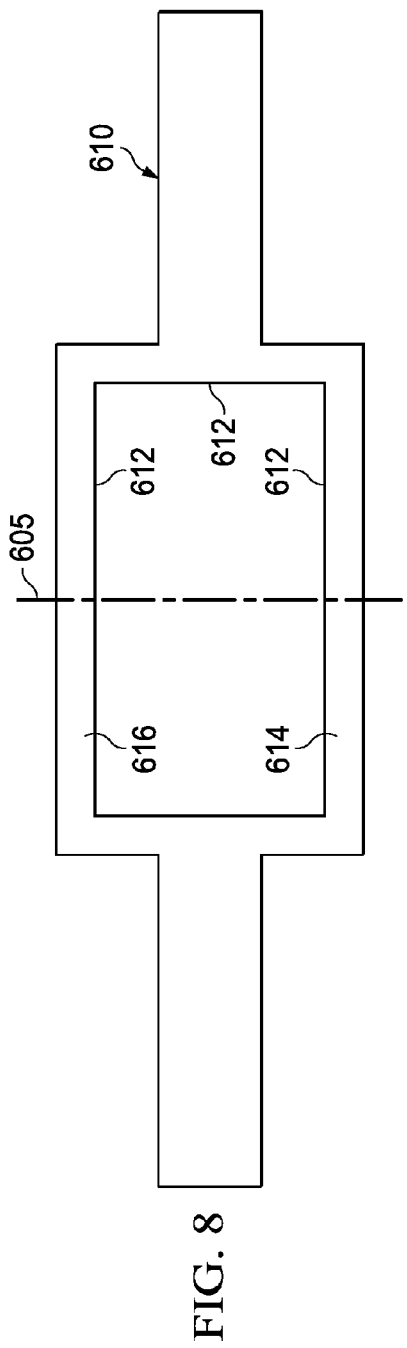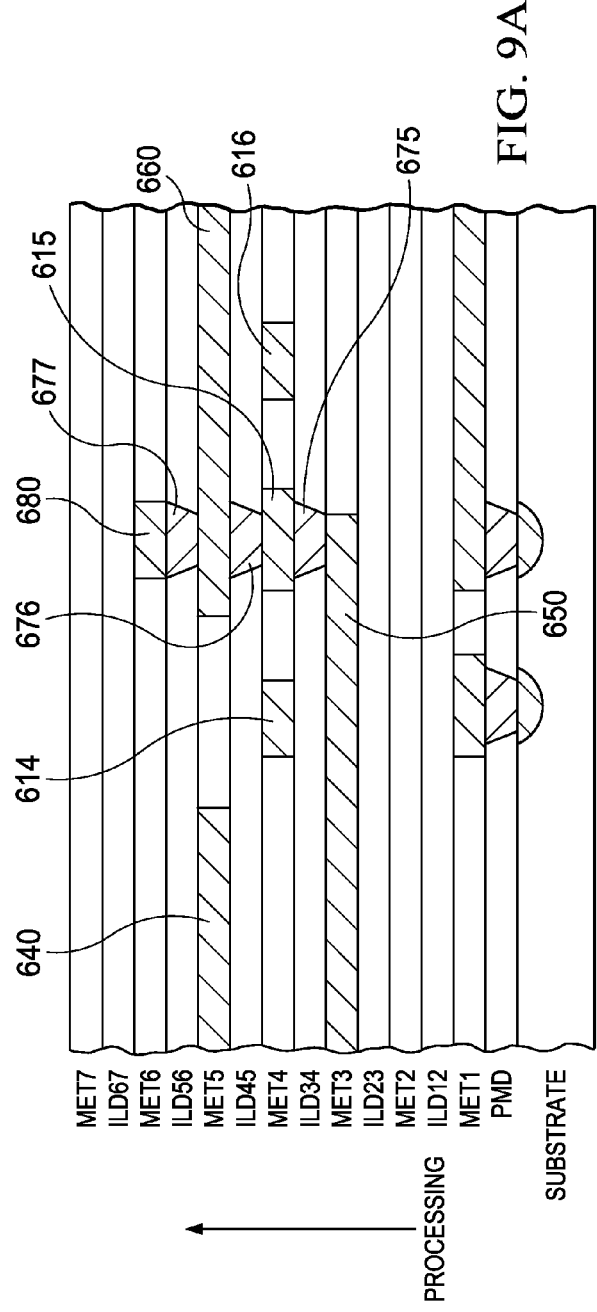

CONDUCTIVE VIA STRUCTURES FOR ROUTING POROSITY AND LOW VIA RESISTANCE, AND PROCESSES OF MAKING

CROSS-REFERENCE TO RELATED APPLICATIONS

This application is related to provisional U.S. Patent Application "Conductive Via Structures for Routing Porosity and Low Via Resistance, and Processes of Making" Ser. No. 61/352,951, filed Jun. 9, 2010, for which priority is claimed under 35 U.S.C. 119(e) and all other applicable law, and which is incorporated herein by reference in its entirety.

STATEMENT REGARDING FEDERALLY SPONSORED RESEARCH OR DEVELOPMENT

Not applicable.

FIELD OF THE INVENTION

The field of the invention includes electronic integrated circuits and integrated circuit substructures, and processes of manufacturing integrated circuits. Among other integrated circuits, various integrated circuits such as analog and mixed signal circuits, digital circuits, wireless circuits, application specific integrated circuits (ASICs), etc., can benefit from the embodiments.

BACKGROUND

The fields of technology include integrated circuit structures and processes for making them.

Processes of making integrated circuit structures have line widths of microscopic dimensions currently measured in nanometers (nm). Process generations having different size line widths from each other, and thought of in general, are called process nodes. An integrated circuit or "chip" generally has a semiconductor substrate (e.g. silicon, silicon germanium or gallium arsenide or other substance), or instead may have an insulating layer, on which semiconductor devices like transistors and diodes are fabricated. Over the semiconductor devices, alternating layers of insulator and conductor are provided, like a layer cake on a cake pan. The conductor layers are patterned and etched into microscopic conducting lines (sometimes called wires and that may have rectangular cross-sections) that are analogous to, but extremely small compared with, say, ordinary electrical conducting wires having a round cross-section as used for home wiring.

The conducting lines are used to interconnect the semiconductor devices to make integrated circuits of varying complexity that under a microscope look like a grid of streets, except at many levels. The conductor layers often are metal but any electrical conductive substance can be useful. The metal layers are called Metal-1 (MET1), Metal-2 (MET2), etc. in order counting upward from above the substrate. Conductive studs called vias are made or deposited through one or more of the insulating layers to electrically connect the conductor layers. Sometimes, the term "via structure" is also used to refer to the combination of conductors and/or their geometry connected with one or more vias. Conductive studs are called contacts when they connect the conducting lines at a lower level to integrated semiconductor devices.

To actually implement a particular desired electronic circuit that has been designed and defined by a netlist of the functional electronic circuits, a form of computer software and system, called a layout tool or place-and-route tool or simply a tool, is used to situate and define the geometric arrangement of the conducting lines, vias and their interconnections with the semiconductor devices. Tools have constraints, called design rules, that are consistent with the process capabilities and also provide some simplification or order for mathematical algorithms or procedures adopted in a tool to lay out a given complicated integrated circuit and avoid what would otherwise a stupefying and unnecessarily complicated array of geometric possibilities in three dimensions of height, width and depth for the conducting lines that the tool is to define. Structures, placements or geometries that do not conform with design rules are forbidden, and called "illegal" in the technological sense used in this art.

In a process node, such as 45 nm (45 nanometers) and smaller, it is believed that in at least some tools, the vias are or will be constrained by a design rule to be on a fixed grid pattern, or gridded via structure. This problematically causes significant inefficiency in the implementation of redundant vias (multiple vias per connection) and introduces an unfortunate impact due to what are called porosity problems. A convenient degree of porosity is important because the conducting lines for a process should be able, or need be able, to intertwined among each other like spaghetti going in various in-out, side-to-side, and up-down directions so that a comprehensive and flexible arrangement of the conducting lines is possible to interconnect the semiconductor devices in almost any desired way to realize any particular desired functional electronic circuits. If no impact to gridded routing with a single via arises, redundant and multiple-via structures are still impacted by porosity problems.

As the semiconductor industry progresses over time, the via resistance is increasing rapidly from node to node increasing the need for redundant vias, not only for good process yield and convenient porosity, but also low wire resistance and via resistance control from a performance perspective. Increasing via resistance and wire resistance in successive process nodes can limit signal propagation delays (picoseconds/millimeter) below the clock speed that is possible to use with high performance transistors in an integrated circuit fabricated at that process node. Such a problem is called wire-limiting, and may be addressed with wide wires (permissions for wider width conducting lines).

However, wide wires present a porosity problem, as illustrated in FIG. 1, because the width of the wide wires obscures or blocks some portions of the chip where vias might otherwise be provided. Routing porosity is vital and critical for optimizing integrated circuit and silicon cost in terms of number of metal levels and in terms of design efficiency (number of drcs or design rule checks). In FIG. 1, for example, two wide wires 110 and 112 on successive metal levels are connected by a via 120. The wide wires 110 and 112 do not just cover places 122, 124, 126 where vias could potentially be situated, like narrower wires would. The wide wires 110 and 112 further and additionally block or prevent placement of other wide wires over places 131, 132, 133, 134, 135, 136, 137, 138 where other wide wires and vias might potentially have been situated, and thus porosity is reduced.

For illustration, to simplify the drawings as shown in FIG. 1, grid locations that are unused for vias are denoted by "x" and each grid location actually used for a via (called a "placed via") is represented by a darkened square and an "x". Conductors at different conductor levels or layers are represented contrastingly, or simply with intersecting or overlapping outlines.

In FIGS. 2-3, another conventional approach arrays some vias on either a 2×1 array, or a 2×2 or larger array of vias covered with a rectangle of metal overlying all the vias in the array. However, the FIG. 2 case of 2×1 presents a large resistance due to the narrow metal, thereby trading off conductivity for compact routing. In a first case in FIG. 2, a segment 140 of conductor at one conductor level is connected with an inverted-L segment 142 at a next-lower level or next-higher level by two vias 151 and 152. In a second case nearby in FIG. 2, a segment 160 of conductor at one conductor level is connected with an inverted-L segment 162 at a next such level by two vias 171 and 172. Via 171 connects a connecting stub or segment 164 for segment 160 with the inverted-L segment 162. Either way, the result presents large resistance, especially as the industry progresses to advanced process nodes.

Moreover, in the case of 2×2 array depicted in FIG. 3, the very large piece of covering metal forces wide metal spacing and an increased routing hazard that lacks porosity as it blocks one or more other conductive lines from occupying a 3×3 array. If wide wire is used, a fifth, central via in FIG. 3 is added in a case called 2×2+1, but the tradeoff of porosity for lower resistance remains. In FIG. 3, wide wires 180 and 182 at successive metal levels are connected by vias 191-194 at corners of the 3×3 array. A further, fifth via 195 may be provided centrally in this low-porosity metal-covered array.

In FIG. 4, this problematic situation is further intensified under a design rule for gridded via layout that imposes a minimum spacing dimension d on potential via x's in both row ("horizontal") and column ("vertical") dimensions or permutations at each metal level. Moreover, the design rule not only has minimum spacing (all permutations) for gridded vias but also no horizontal or vertical adjacency allowed. FIG. 4 shows the no-adjacency rule in operation near a region 210 of placed vias having a neighboring placed-via 212. At some distance from via 212, a pair of vias 214 is displaced away horizontally from a site 215 of potential placement. Site 215 is termed a "skip grid" here because it is skipped to situate the via pair 214 under the design rule. In FIG. 4, the X 215 is chosen to be skipped in that the via 214 could optionally be placed in either location 215 or 214. A placed via prohibits another via from being placed in either horizontally and vertically adjacent locations, but not the diagonally adjacent locations. Locations 214 and 215 are not obstructed by any other via. This deviates from a strict regular grid where the via would have to be placed at 215. The skip grid allows the via to be shifted horizontally and/or vertically by a single grid location as long as it does not violate the above adjacency rule.

In FIGS. 5A and 5B, the no-adjacency design rule also forbids instances 1×2 array 230, 2×2 array 220, a 3×3 square array (not shown), and other orthogonal arrays. The rule can apply even with infinite isolation from other grids, meaning numerous unused via locations "x" surrounding each such array. The large X over each of FIGS. 5A and 5B represents the forbidden nature of each of these two layouts.

Accordingly, significant departures and alternatives in structures, circuits, and processes for addressing the above considerations and problems would be most desirable.

SUMMARY OF THE INVENTION

Generally, and in a form of the invention, an integrated circuit structure includes a first conductive layer including a first forked conductive structure, an insulating layer substantially disposed over the first forked conductive structure, a plurality of conductive vias through the insulating layer and electrically connecting with the first forked conductive structure, and a second conductive layer including a second forked conductive structure substantially disposed over at least a portion of the insulating layer and generally perpendicular to the first forked conductive structure, the plurality of conductive vias electrically connecting with the second forked conductive structure.

Generally, an inventive process of manufacturing an integrated circuit structure involves a process including depositing a first conductive layer, fabricating a first forked conductor from the first conductive layer, forming an inter-level-dielectric (ILD) layer, depositing plural vias that penetrate the ILD layer onto the forked conductor, depositing a second conductive layer, fabricating a second forked conductor from the second conductive layer, the second forked conductor in electrical connection with the plural vias.

Generally, in another form of the invention, an integrated circuit structure includes a substrate with at least one transistor, at least one dielectric layer formed on the substrate, an interconnect structure having conductor levels above the substrate and formed over the at least one dielectric layer and including contact vias to the transistor, the interconnect structure having at least one level that includes a window-frame-shaped structure situated along at least one wide wire to form at least first and second narrow wires defining an inner edge having a rectangular shape, the interconnect structure having another level with a second wide wire terminating in a fork-shaped conductor that has another first and second narrow wires, and at least four vias electrically connecting the fork-shaped conductor to the window-frame-shaped conductor, a first two of the four vias connecting the first and second narrow wires to at least one of the narrow wires of the fork-shaped conductor and a second two of the four vias connecting the first and second narrow wires to at least the other one of the narrow wires of the fork shaped conductor.

Generally, in a further form of the invention, an integrated circuit structure includes plural levels of metal interconnect and conductive vias variously distributed over at least part of the area thereof as viewed broadside and in conformance with a fixed-grid pattern defining a whole number of a minimum spacing dimension between any two vias, the metal interconnect including first and second wide metal wires each at least approximately as wide as said spacing dimension and respectively situated at least at two different levels, each said wide metal wire branching into at least first and second narrow and substantially parallel wires separated at least two spacing dimensions apart, and at least four vias connecting the narrow wires to each other between the levels, the metal interconnect further including an adjacent route and the narrow wires establishing a porosity occupied by the adjacent route as close as one spacing dimension.

Generally, in another manufacturing process form of the invention, an integrated circuit manufacturing process includes a wafer fabrication process less than 45 nanometers including deposition of plural levels of metal interconnect to establish a pattern including tines-connected tuning forks having a porosity admitting at least one adjacent route.

Generally, and in a type of integrated circuit form of the invention, such integrated circuit includes an interface, a processor coupled to the interface, and a modem-related circuit coupled to the processor, each of the interface, the processor and the modem-related circuit having transistors and at least one of the interface, the processor and the modem-related circuit having its transistors coupled with plural levels of metal interconnect and conductive vias variously distributed over at least part of the area thereof as viewed broadside and in conformance with a fixed-grid pattern defining a whole number of a minimum spacing dimension between any two vias, the metal interconnect including first and second wide metal wires each at least approximately as wide as the spacing dimension and respectively situated at least at two different levels, each the wide metal wire branching into at least first and second narrow and substantially parallel wires separated at least two spacing dimensions apart, and at least four vias connecting the narrow wires to each other between the levels, the metal interconnect further including an adjacent route and the narrow wires establishing a porosity occupied by the adjacent route as close as one spacing dimension.

Other structures, devices, and processes are also disclosed and claimed.

BRIEF DESCRIPTION OF THE DRAWINGS

FIG. 8 is a layout diagram of a window-shaped or apertured conductor for use in FIG. 7.

FIG. 9A is a cross-sectional diagram of the FIG. 9 structure, and the FIG. 9A diagram also represents a flow diagram of a process embodiment.

Corresponding numerals or designators in different Figures indicate corresponding parts except where the context indicates otherwise. A minor variation in capitalization or punctuation for the same thing does not necessarily indicate a different thing. A suffix .i or .j refers to any of several numerically suffixed elements having the same prefix.

DETAILED DESCRIPTION OF EMBODIMENTS

Here, the problems described above and other problems are solved by remarkable embodiments of structure and process that reduce both blockage and resistance. Some of these embodiments are herein called a 'Tuning Fork Via' or 'Fork Via', and place four (4) vias on a sparse grid and connect them in a manner that minimizes the resistance of the layer transition between forked conductors on separate conductive layers of the integrated circuit. This Fork Via type of embodiment is particularly effective for use in so called 'Non-Default Routes' (NDR), which is a technical term meaning use of wide wires when narrower wires are the default routing (DR) choice. When two fork vias are oriented with the plural conductors of their forks joined collinearly for low resistance, they define an open-window-frame-shaped structure with a rectangular inner edge that also confers porosity. The various embodiments are used in various combinations and orientations that provide further combination embodiments.

A via structure can represent a blocking hazard to adjacent routes of the conductive lines. In other words, it can lack sufficient porosity. Various via structure embodiments herein minimize the blocking hazard or impact to be no greater than the wide wire to which it is connecting.

Various embodiments thus confer an efficient balance of resistance and routing blockage. Indeed, the embodiments advantageously obviate the problematic tradeoff itself between resistance and routing blockage. The remarkable result is lowest blockage for a given resistance in a gridded via technology, and the embodiments readily accommodate automatic routing tool support.

Figure 1:
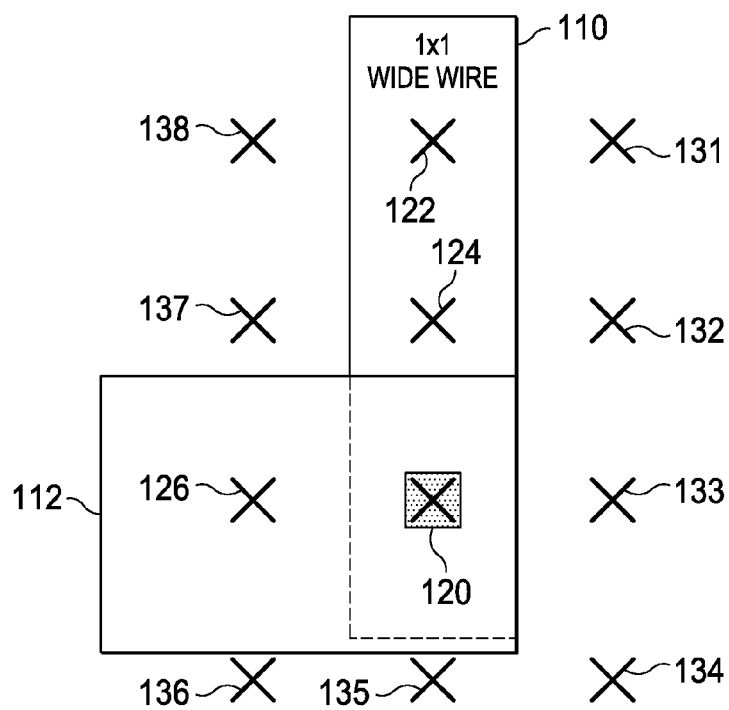
FIGS. 1-5B are each a layout diagram wherein an integrated circuit wire is shown with a larger rectangle, a via with a smaller rectangle, and a place by an "X"; and wherein the layout diagrams show various problematic instances.
Figure 6A:
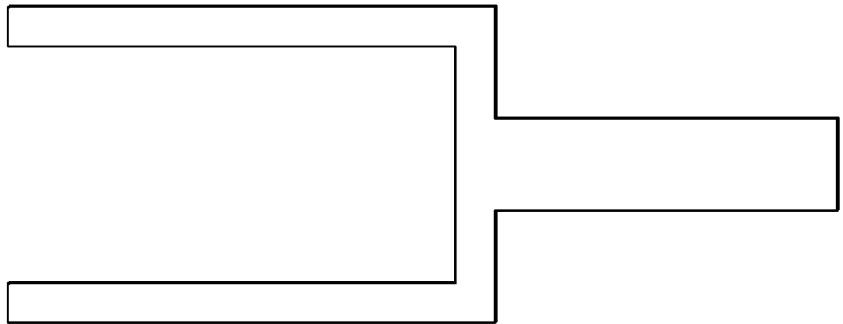
FIG. 6A is a layout diagram of a fork-shaped conductor for use in FIG. 6.
Figure 6:
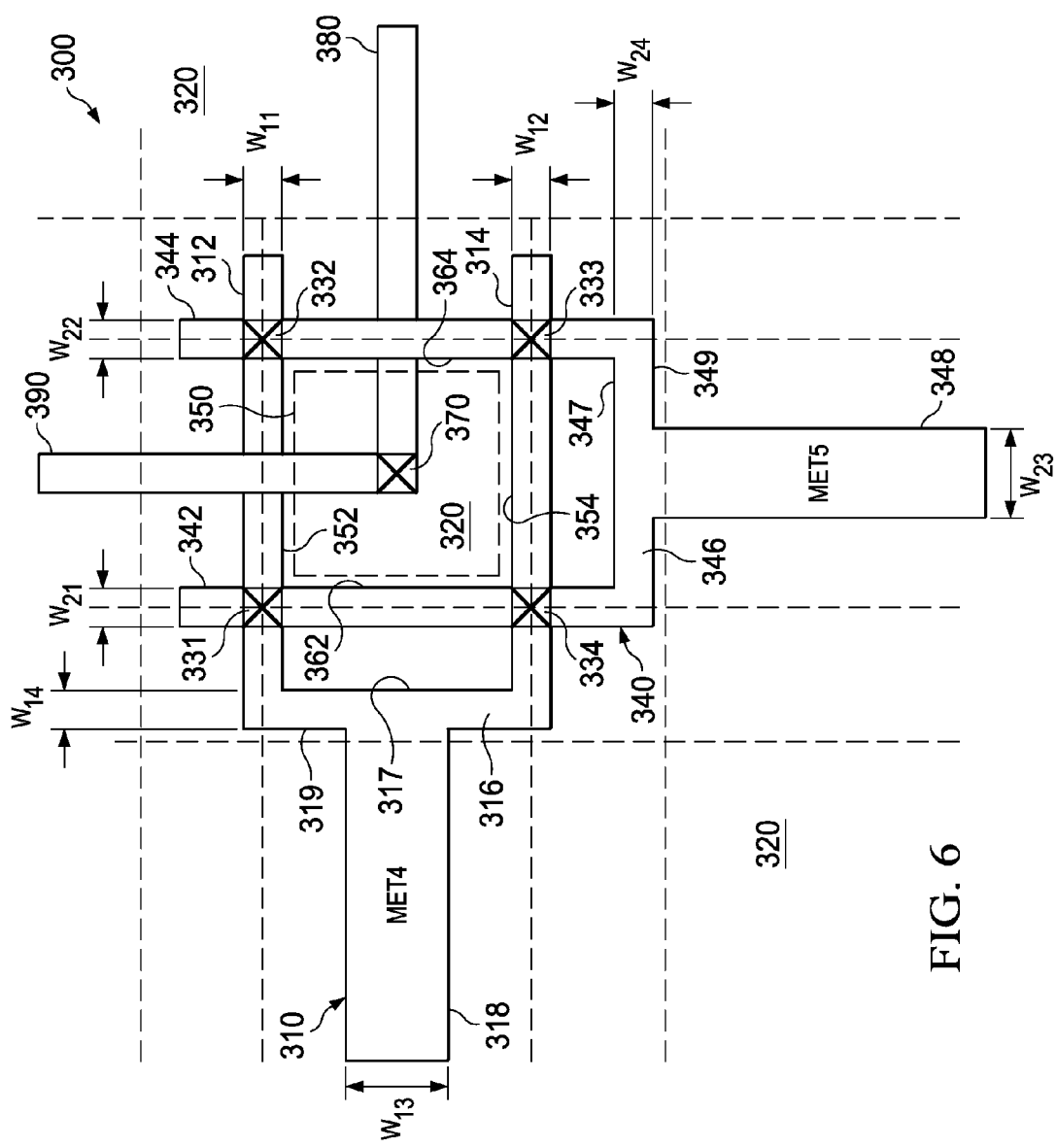
FIG. 6 is a layout diagram of a structure embodiment having conductors for solving various problems.

In FIG. 6, NDR (Non-Default Routes with wide wire) are used for routing clock signals or other nets for which low resistance is desirable. (Nets are layouts supporting different portions of a circuit netlist.) Wide wire blocks an adjacent track in FIG. 1, but by splitting a wide wire 318 into a fork 310, the next track remains open for an independent path such as that occupied by conductor 380 in MET 4. No additional blockage is introduced over the wide wire (3 tracks). Visual inspection and/or scan testing of first silicon confirms that the layout is successful.

In FIG. 6, an integrated circuit structure 300 has a conductive layer MET4 including a first forked conductive structure 310. An insulating layer 320 is disposed over forked conductive structure 310 and represented by the white space of FIG. 6 generally. Conductive vias 331-334 penetrate through the insulating layer 320 and electrically connect with forked conductive structure 310. A second conductive layer MET5 also has a forked conductive structure 340 substantially disposed over at least a portion of the insulating layer 330 and generally perpendicular, orthogonal, or at right angles to the first forked conductive structure 310 as microscopically viewed broadside to the chip. The conductive vias 331-334 electrically connect forked conductive structure 310 and themselves with the forked conductive structure 340. Forks 310 and 340 are non-coplanar, and together generally define a chimney-shaped central volume 350 between the forks of both of them. Central volume 350 is bounded by the inner edges 352, 354 of fork 310 and the inner edges 362, 364 of fork 340. Central volume 350 is extended perpendicular to the respective layers of forks 310 and 340 and also perpendicular to the plane of FIG. 6.

In FIG. 6, notice that fork 310 (and 340) includes a pair of parallel conductor segments 312, 314 (342, 344). A transverse conductive portion 316 (346) joins the parallel conductor segments 312, 314 at a first side 317 of the transverse conductive portion 316. A further conductor segment 318 extends from a second side 319 of the transverse conductive portion 316 opposite the pair of parallel conductor segments 312, 314. (Corresponding description of the analogous 34x numerals of fork 340 is omitted for conciseness and it tracks that of numerals 31x of fork 310.)

Porosity is efficiently utilized by providing another conductive via 370 through the insulating layer 320 in that central volume 350 and substantially electrically insulated from both of the forks 310 and 340. The first conductive layer MET4 (or some lower conductive layer) includes another conductive structure 380 entering the central volume 350 and electrically connecting with conductive via 370 and substantially electrically insulated from the first fork 310 at least in the vicinity of first fork 310. The second conductive layer MET5 (or some higher conductive layer) includes another conductive structure 390 entering central volume 350 and electrically connecting with via 370 and substantially electrically insulated from the second fork 340, at least in the vicinity of second fork 340.

In FIG. 6, the wide conductor segment 318 (348) is wider than each of the parallel conductor segments 312 (342) and 314 (344). Also, in some embodiments a continuity of resistance along the conductive paths is maintained by depositing wide conductor segment 318 (348) with width $w_{13}$ ($w_{23}$) that is approximately equal to a sum of widths $w_{11}+w_{12}$ (see also $w_{21}+w_{22}$) of the parallel conductor segments 312 (342) and 314 (344) and twice the width $w_{14}$ ($w_{24}$) of the transverse conductor segment 316 (346). In some of these embodiments, the wide conductor segment 318 (348) width $w_{13}$ ($w_{23}$) is approximately twice as wide as a width of each of the parallel conductor segments 312 and 314 (342 and 344), which are equal in width to each other. In still further ones of these embodiments, the first forked conductive structure 310 has one, some, or all of its segment widths $w_{1j}$ respectively equal to the corresponding widths $w_{2j}$ of segments of the second forked conductive structure 340.

In FIG. 6A, a basic forked structure embodiment forms a component or macro that is used repeatedly in the integrated circuit (e.g., two or more instances with some of them orthogonal at successive conductor layers as in FIG. 6). Also, such combinations are further situated repeatedly elsewhere in the integrated circuit and at the same two or more and/or a different two or more conductor layers. Together with some, many or even all of such combination embodiments, independent structures like 370, 380, 390 are suitably interpolated, co-located or otherwise established to take advantage of the porosity afforded by the combination embodiments.

Figure 7:
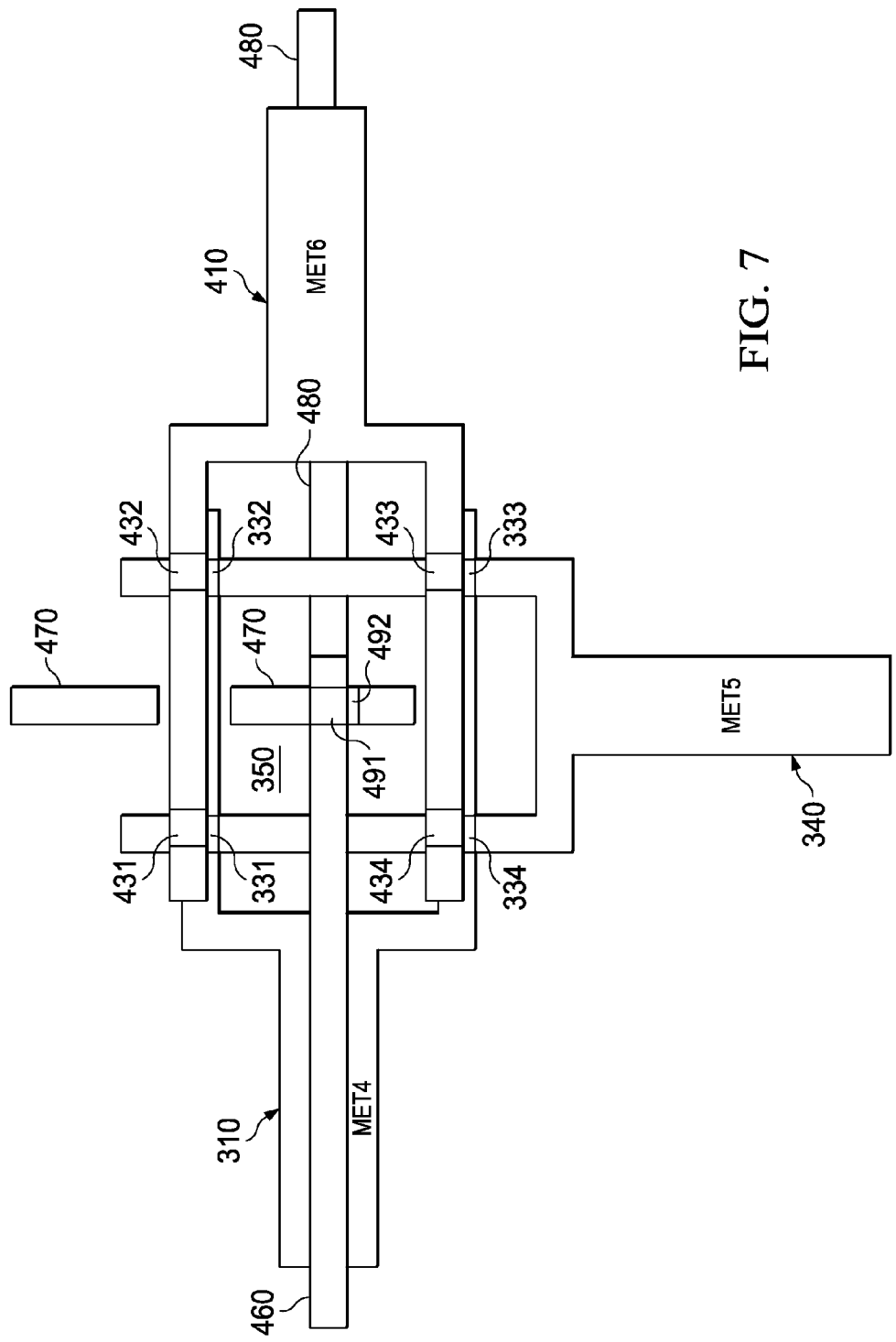
FIG. 7 is a layout diagram of another structure embodiment having conductors for solving various problems.

In FIG. 7, an embodiment applying three forks of FIG. 6A is illustrated. Compared with FIG. 6, fork 310 at MET4 and fork 340 at MET 5 are combined with a fork 410 at conductive layer MET6. Fork 410 has its two fork segments (or tines) parallel to, but oppositely oriented from, the two fork segments (or tines) of fork 310. A set of four vias 331-334 couple fork 310 and fork 340 between MET4 and MET 5, and another set of four vias 431-434 couple fork 410 and fork 340 between MET6 and MET 5. One or more of the forks 310, 340, 410 can also have double conductors of narrower width substituted in place of them for particular circuit layout purposes. Associated with the composite forked structure of FIG. 7 is a further optional non-related net conductor 460 at MET6 entering the central volume 350, a perpendicular conductor 470 at MET5 joined to conductor 460 by a first via 491, and a conductor 480 at MET4 perpendicular to conductor 470 and joined to conductor 470 by a second via 492. Conductor 460 at MET6 enters the central volume 350 parallel to the wide conductor segment of fork 310 of MET4, but two metal levels up therefrom. Conductor 470 exits central volume 350 parallel to and independent from the tines of fork 340 while occupying the same metal level MET 5. Conductor 480 at MET4 exits central volume 350 parallel to conductor 410 of MET 6, but two metal levels down therefrom.

In FIG. 8, two fork vias of FIG. 6A are oriented with the two conductors of their forks joined collinearly for low resistance and with the forks oppositely disposed with respect to a transverse axis 605. The forks, together forming one composite structure 610, define an open-window-frame-shaped structure 610 with a rectangular inner edge or aperture 612 (filled or unfilled with dielectric and/or via) as shown. The window-frame conductor 610 with its rectangular inner edge 612 also confers porosity and defeats seeming necessities imposed by conventional structures that otherwise impose some tradeoff between porosity and conductance. Some embodiments have three or more parallel conductors in the forks of FIG. 6A, and in FIG. 8 the window-frame-shaped structure in some embodiments has two or more rectangular inner edges or apertures in the conductive material of the structure. Also, the conductive material can have multiple laminae or sublayers in it at a given conductor layer.

Figure 9:
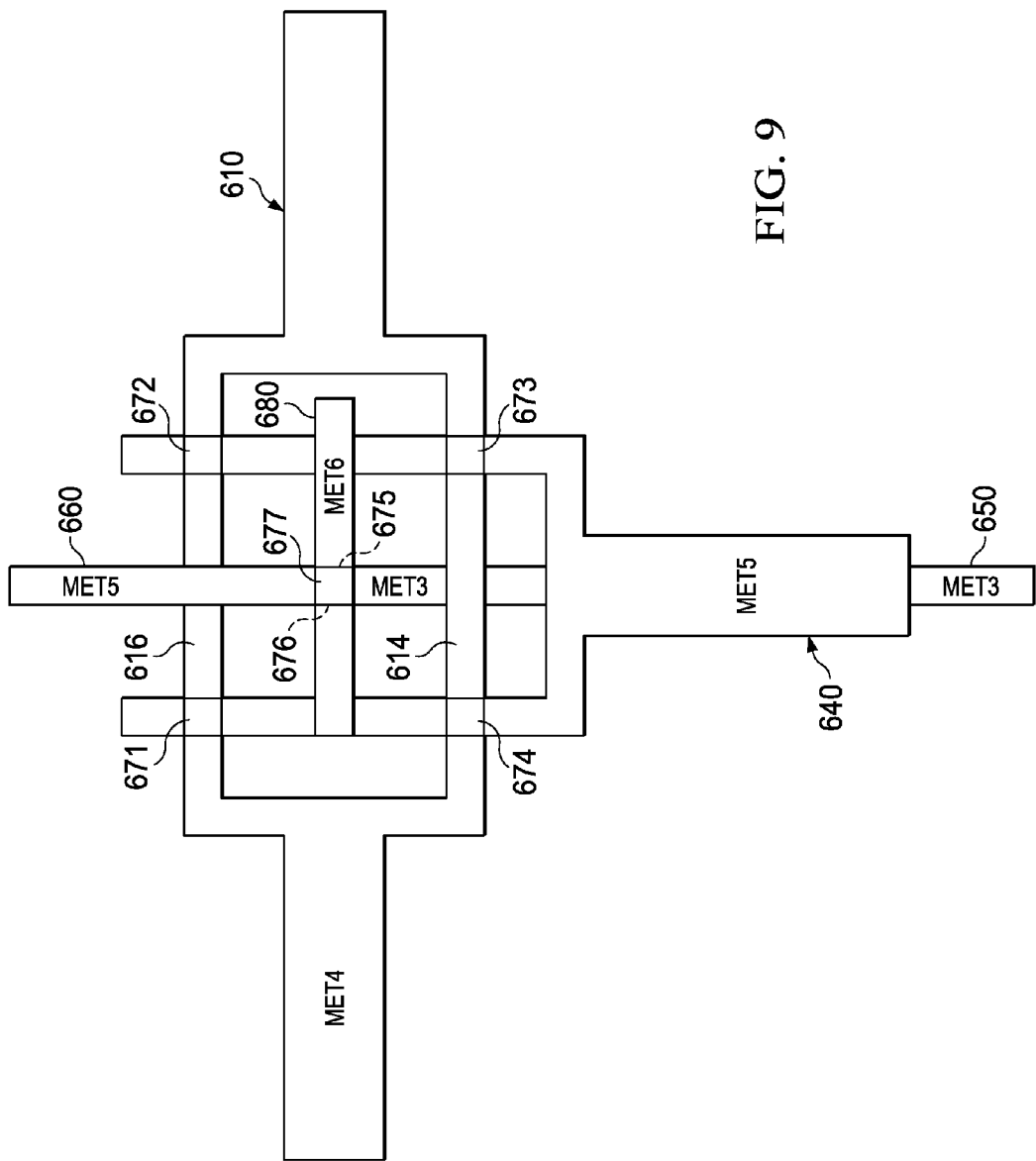
FIG. 9 is a layout diagram of a further structure embodiment having conductors for solving various problems.

Together FIGS. 9 and 9A depict not only a structure embodiment but also a manufacturing process embodiment. In FIGS. 9 and 9A, a process grows transistors and other devices on a wafer Substrate, provides gate oxide, gates, contacts and pre-metal dielectric PMD, and then builds the layer cake succession of metal and inter-level dielectric layer-pairs MET1, ILD12; MET2, ILD23; etc., with vias connecting or joining patterned and etched conductive metal wires at strategic points. An optional unrelated net conductor 650 is patterned and etched from metal layer MET3. An intermetal dielectric ILD34 layer is next formed on MET3, followed by via deposition of a via 675 penetrating the ILD onto conductor 650. Next, metal layer MET4 is deposited, and the window-frame conductor 610 of FIGS. 8 and 9 is patterned and etched from metal layer MET4, with portions 614 and 616 shown in cross-section in FIG. 9A. A metal island 615 also is deposited, patterned and etched and remains atop via 675. Another ILD layer formation of ILD45 is followed by via deposition of vias 671-674 that penetrate ILD45 onto window-frame conductor 610, and concurrent deposition of a via 676 that stands atop metal island 615 above via 675, all these insulated from window-frame conductor 610. Next, metal layer MET5 is deposited onto the ILD45 beneath, and both a fork 640 of FIG. 6A and a second unrelated net conductor 660 are patterned and etched from metal layer MET5. The resulting fork 640 is in electrical connection with vias 671-674, and conductor 660 is in electrical connection with and on via 676. Conductor 660 exits the central volume between the tines of fork 640 in FIG. 9. Another ILD layer formation ILD56 is followed by via deposition of a via 677 that stands on conductor 660 above vias 675 and 676, all the vias 675-677 insulated not only from window-frame conductor 610 but also fork 640. Next, metal layer MET6 is deposited onto ILD56 and via 677 beneath, and a third unrelated net conductor 680 is patterned and etched from metal layer MET6. The optional unrelated net conductor structure 650, 675, 615, 676, 660, 677, 680 has its narrow MET3 conductor 650 parallel to the wide MET5 conductor of fork 640, has its narrow MET 5 conductor 660 collinear with the wide MET5 conductor of fork 640, and has its narrow MET6 conductor 680 parallel with the wide MET 4 conductors of window-frame conductor 610. Subsequent depositions may add more ILD and MET layers if desired, and suitably add a top protective layer and bonding pads (not shown). The thus-fabricated wafer is sawed into dice and transferred to assembly/test. Assembly (packaging) of the dice into finished integrated circuits, as well as test operations at each appropriate process station or point facilitate production of the finished integrated circuits. The finished integrated circuits suitably have ball grid array packaging as illustrated by circular dots in FIG. 19, or any other suitable packaging. The functional circuits implemented in the integrated circuits using the embodiments herein for instance can be for an applications processor IC, wireless modem, power IC, etc. as illustrated in FIG. 20. The chips are made by a process embodiment as taught herein to improve a larger overall system manufacturing process like that of FIG. 21 as well.

A simplified line diagram mode of compact illustration is adopted in FIGS. 10-17. Each line is a narrow wire at the indicated metal level METx, except that NDR (wide) wires are assumed at the joining of forks and joining of window frames with such NDR wires. Wires at different metal levels are electrically connected by placed vias, shown as small squares.

Figure 10:
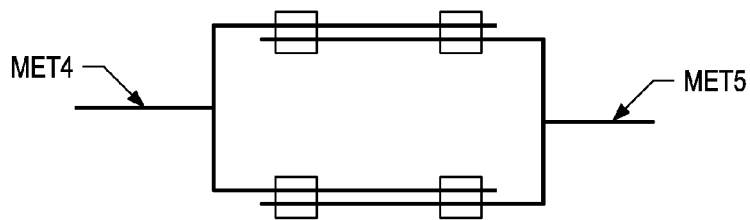
FIGS. 10-18 are each a simplified layout diagram of a respective additional structure embodiment having conductors for solving various problems.

In FIG. 10, oppositely disposed forks on successive metal levels MET4 and MET5 are joined by four vias.

Figure 11:
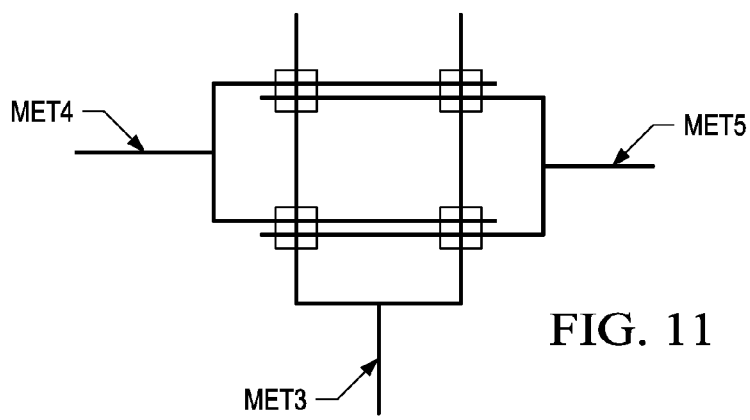

In FIG. 11, the embodiment is similar to FIG. 10 and further adds a perpendicular fork on MET 3. Also, this embodiment is similar to FIG. 7 except that the perpendicular fork on MET 3 is beneath the oppositely disposed forks instead of layered between them.

Figure 12:
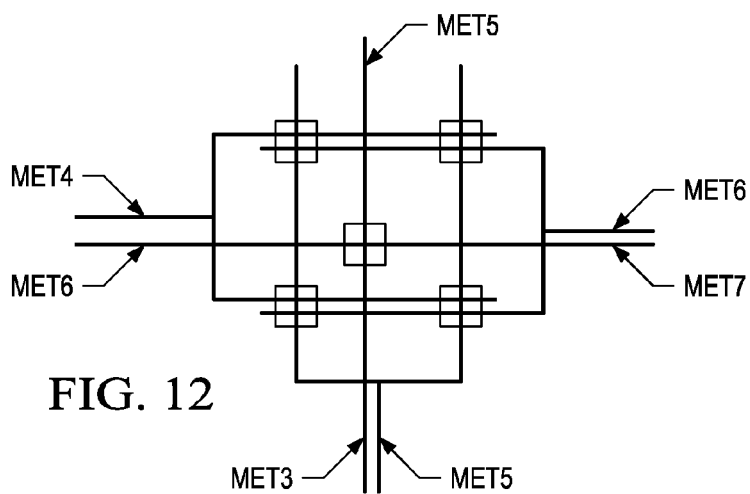

In FIG. 12, the embodiment is similar to FIG. 7 except that optional unrelated structure is provided at MET3, 5, 6, 7. The unrelated structure may also include forks in any physically-feasible combination.

Figure 13:
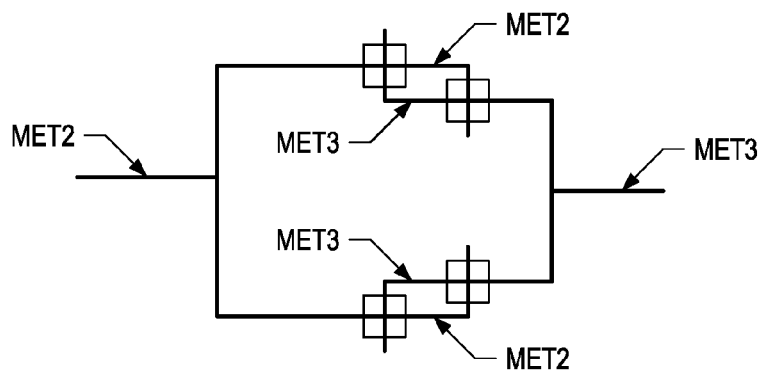

In FIG. 13, two forks, with elbowed tines having complementary elbows, are connected by four vias (or at least one via for each elbow connection). The fork tine-to-tine spacing differs for the two forks.

Figure 14:
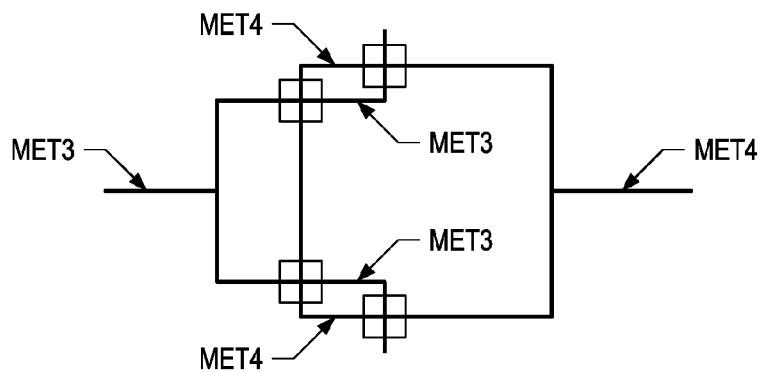

In FIG. 14, a fork with elbowed tines on one metal level MET3 is connected by four vias with a window-frame on another metal level MET4. The window-frame on MET4 can be elbowed at the corners instead, as would be indicated by interchanging the legends "MET3" and "MET4" at the corners between the vias. Rectangular-U shaped-indents and/or shaped-outdents and multiple elbows are variously established in wide wires, in fork tines, and/or in window-frame sides in some further embodiments. Forks and window-frames can be electrically connected in series (cascade), parallel, series-parallel, and in any of a variety of combinations and orientations.

Figure 15:
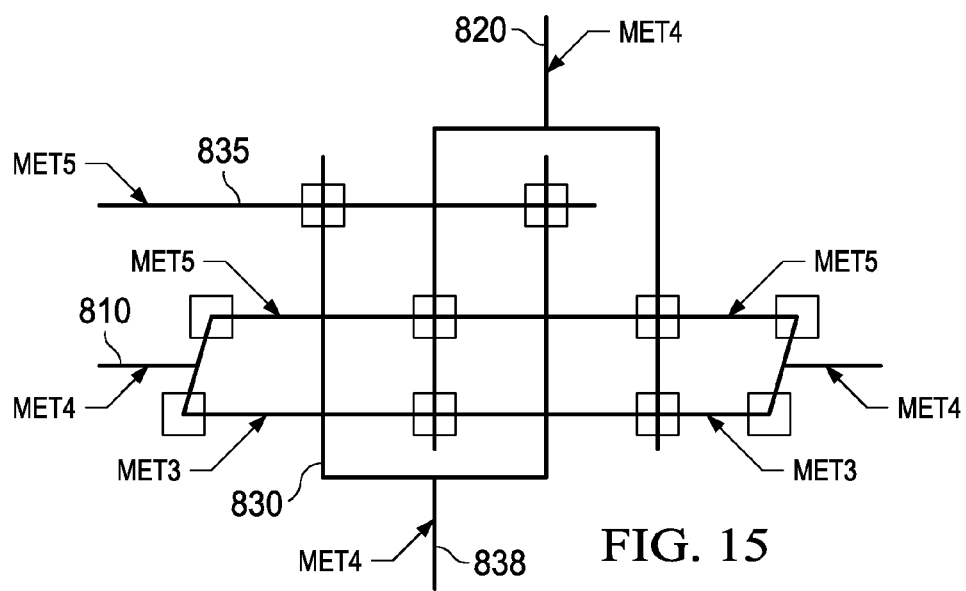

In some embodiments, one fork of FIG. 6A has a forked geometry disposed on a given metal level or one window frame of FIG. 8 has a forked geometry disposed on a given metal level. FIGS. 15 and 15A show that some other embodiments have a fork disposed in a plane through plural metal levels, so that it is in another orientation or dimension from the forks of FIG. 6 for instance. Still other embodiments have a window frame disposed in a plane through plural metal levels, formed by joined oppositely-disposed forks disposed in such plane.

In FIG. 15, a wide wire 810 on MET4 is connected by vias to narrow wires on MET3 and MET 5, thereby collectively providing a fork disposed in a plane through plural metal levels. A perpendicular fork 820 fabricated only on MET 4 has narrow wire tines joined by at least one via each to the respective narrow wires on MET3 and MET 5. Optional unrelated structure 830 exploits the beneficial porosity and provides an incoming conductor 835 at MET5 coupled by a central via to a transverse outgoing conductor 838 at MET4. The optional structure 830 itself is suitably forked in some embodiments such as shown in FIG. 15.

Figure 16:
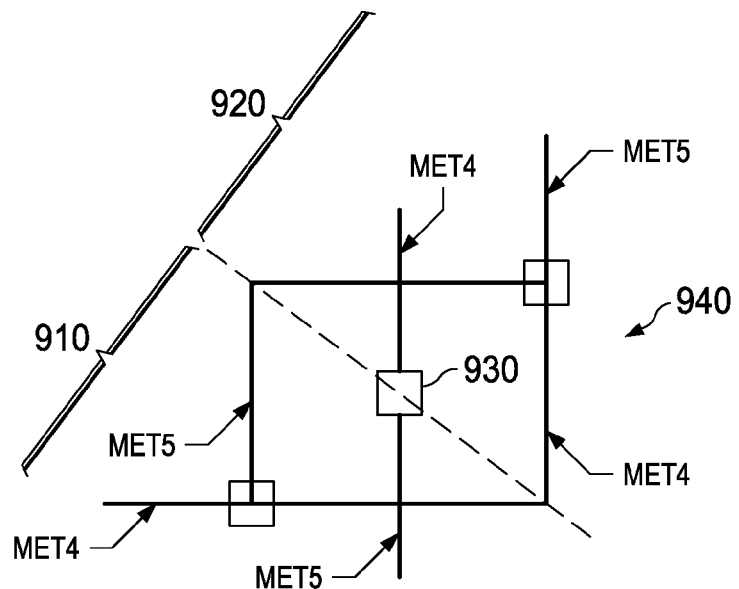

In FIG. 16, two opposed forks 910 and 920 are joined on different metal levels MET 4 and MET 5. Fork 910 has non-parallel tines, and fork 920 has non-parallel tines. An optional unrelated structure 930 is beneficially interpolated into the porosity. Forks 910, 920 together also form a non-planar open window frame structure 940.

Figure 17:
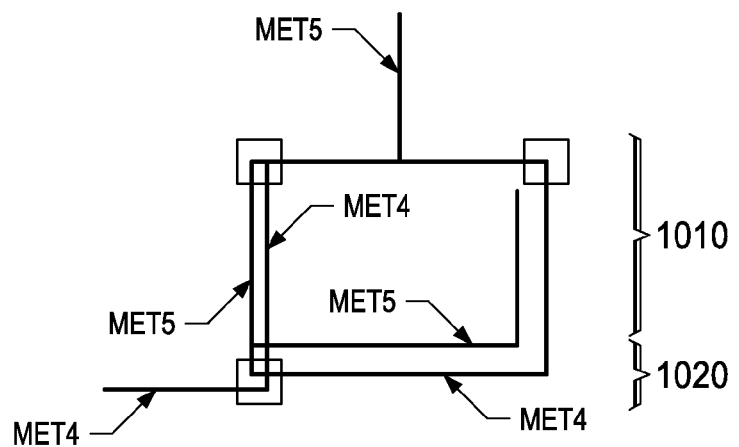

In FIG. 17, the opposed forks 910, 920 of FIG. 16 have further conductors added at MET4 and MET5. In a first interpretation of this FIG. 17 embodiment, a double fork 1010 has NDR entering from MET5 and has a first pair of tines on MET5 and a second pair of tines on MET4. Double fork 1010 is connected to a fork 1020. Fork 1020 has NDR entering from MET4 and tines extending rightward on consecutive metal levels MET4 and MET5. The double fork 1010 joins single fork 1020. In a second, alternative interpretation, an open window frame all on MET5 has NDR entering from MET5. A single fork all on MET4 is connected by three vias up to the open window frame on MET5. Beneficial porosity in a central volume provides space for convenient place-and-route of optional unrelated structures.

Figure 18:
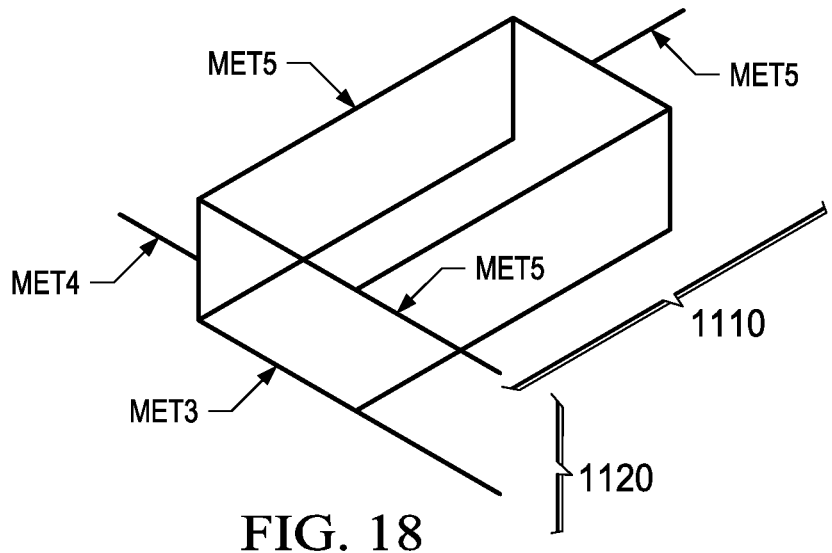

A FIG. 18 embodiment also admits of analogous multiple interpretations. (In FIG. 18, the illustration is a simplified perspective line drawing for some sense of three-dimension that way, and the up-down corner lines represent vias or stacks of vias and metal.) Compared to fork 1020 of FIG. 17, the fork 1020 has tines that respectively occupy non-consecutive metal levels MET 3 and MET5 and fork 1020 NDR enters intermediately on MET4 and connects to those tines. Double fork 1110 of FIG. 18 is similar geometrically to double fork 1010 of FIG. 17 and at MET5 they have a similar first pair of tines, but double fork 1110 in FIG. 18 has its second pair of tines at MET3 instead of MET4. The tines of fork 1120 are extendable and shown extended to connect to other structures.

Figure 19:
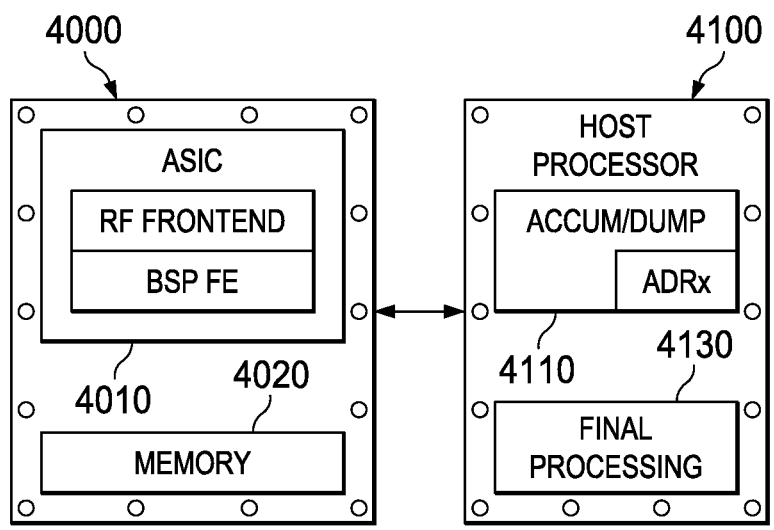
FIG. 19 is a partially block, partially pictorial diagram of two integrated circuit dice utilizing any of the embodiments of structure and process shown in the other Figures.
Figure 20:
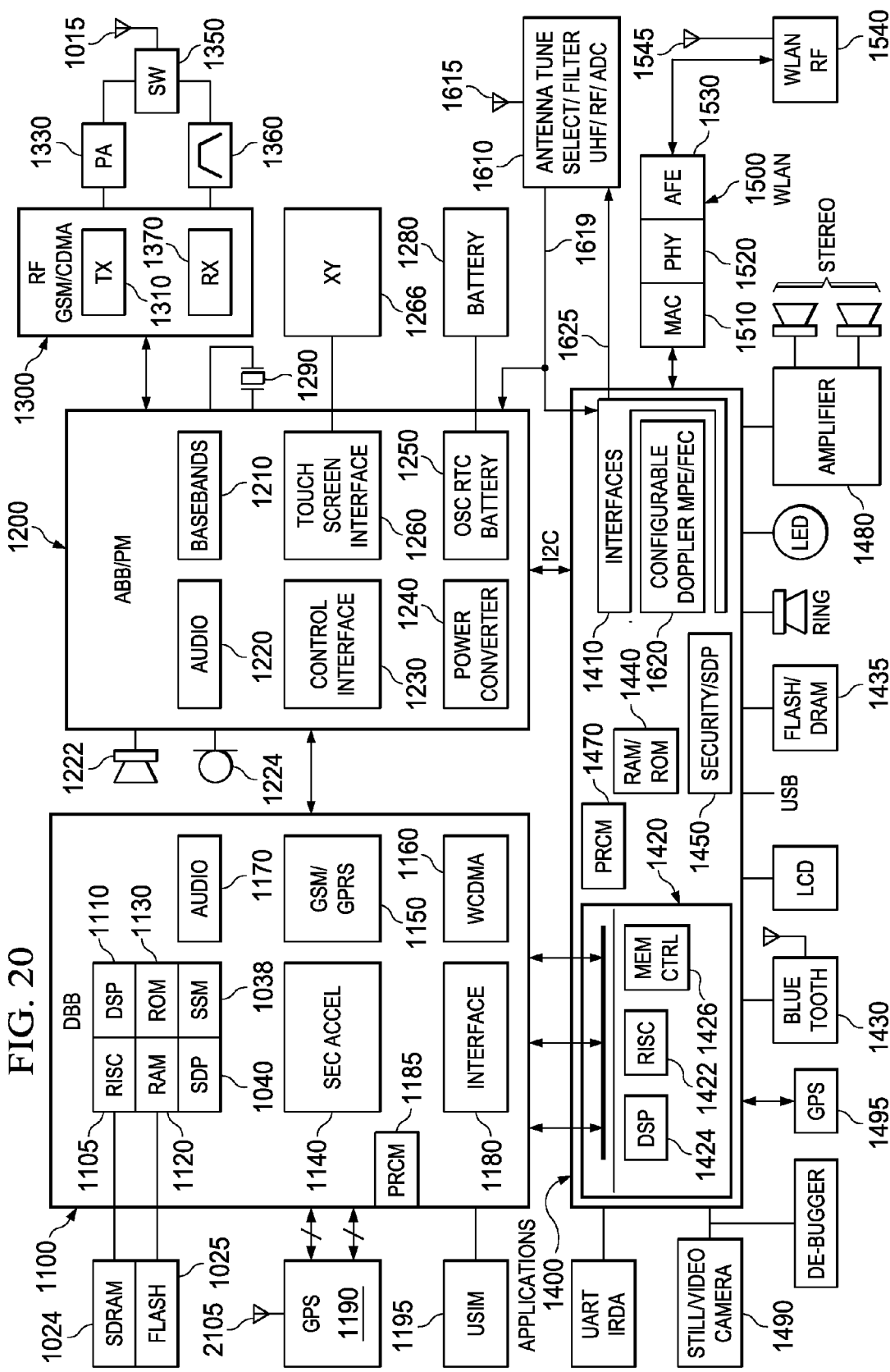
FIG. 20 is a block diagram of a system embodiment utilizing any of the embodiments of structure and process shown in the other Figures.

FIG. 19 illustrates an example of using the embodiments of the other Figures herein in chip embodiments and in system embodiments of FIG. 20, such as from Published US Patent Application 20090168843 dated Jul. 2, 2009, (TI-65435 of Texas Instruments Incorporated), all of which is hereby incorporated herein by reference. A first chip 4000 has an ASIC block 4010 that implements an RF Front end and BSP front end for a satellite receiver. A memory area 4020 is situated on-chip and coupled with ASIC block 4010. A host processor chip 4100 includes a microprocessor with functional circuitry 4110 for ADRx accumulate-and-dump ACC/DUMP Rx, as well as a block 4130 for final processing. The wires of the chips 4000 and 4100 are laid out by place-and-route according to the teachings and other Figures herein.

Analogous chips 1100-1500 are prepared as in FIG. 20 with the wires of the chips laid out by place-and-route according to the teachings and other Figures herein. FIG. 20 illustrates inventive integrated circuit chips including chips 1100, 1200, 1300, 1400, 1500, and GPS 1190 (1495) for use in any one, some or all of the blocks of a communications system. The skilled worker uses and adapts the integrated circuits to the particular parts of the communications system as appropriate to the functions intended.

It is contemplated that the skilled worker uses each of the integrated circuits shown in FIG. 20, or such selection from the complement of blocks therein provided into appropriate other integrated circuit chips, or provided into one single integrated circuit chip, in a manner optimally combined or partitioned between the chips, to the extent needed by any of the applications supported by a DVB station, cellular telephone base station, a personal computer(s) equipped with WLAN, WLAN access point and Voice WLAN gateway, as well as cellular telephones, radios and televisions, Internet audio/video content players, fixed and portable entertainment units, video phones, routers, pagers, personal digital assistants (PDA), organizers, scanners, faxes, copiers, household appliances, office appliances, microcontrollers coupled to controlled mechanisms for fixed, mobile, personal, robotic and/or automotive use, combinations thereof, and other application products now known or hereafter devised for increased, partitioned or selectively determinable advantages.

In FIG. 20, an integrated circuit 1100 includes a digital baseband (DBB) block that has a RISC processor 1105 (such as MIPS core(s), ARM core(s), or other suitable processor) and a digital signal processor 1110 such as from the TMS320C55x™ DSP generation from Texas Instruments Incorporated or other digital signal processor (or DSP core) 1110, communications software and security software for any such processor or core, security accelerators 1140, and a memory controller. A power resets and control module PRCM 1185 provides power management circuitry for chip

1100. Chip 1100 is coupled to location-determining circuitry 1190 satellite positioning such as GPS (Global Positioning System).

In FIG. 20, a mixed-signal integrated circuit 1200 includes an analog baseband (ABB) block, SPI (Serial Port Interface), digital-to-analog/analog-to-digital conversion DAC/ADC block, a power conversion block and RF (radio frequency) Control, and coupled to RF chip 1300.

Further in FIG. 20, an integrated circuit chip or core 1400 is provided for applications processing and more off-chip peripherals. It is believed that this type of chip is especially suitable for inclusion of embodiments taught herein for advanced process node manufacture with embodiments of process and structure taught herein, among many other IC types of applications for the embodiments. Chip (or core) 1400 has interface circuit 1410 including a high-speed WLAN 802.11a/b/g interface coupled to a WLAN chip 1500. Further provided on chip 1400 is an applications processing section 1420 which includes a RISC processor 1422 (such as MIPS core(s), ARM core(s), or other suitable processor), a digital signal processor (DSP) 1424 such as from the TMS320C55x™ DSP generation and/or the TMS320C6x™ DSP generation from Texas Instruments Incorporated or other digital signal processor(s), and a shared memory controller MEM CTRL 1426 with DMA (direct memory access), and a 2D (two-dimensional display) graphic accelerator. Speech/voice codec/speech recognition functionality is suitably processed in chip 1400, in chip 1100, or both chips 1400 and 1100.

The RISC processor 1422 and the DSP 1424 in section 1420 have access via an on-chip extended memory interface (EMIF/CF) to off-chip memory resources 1435 including as appropriate, mobile DDR (double data rate) DRAM, and flash memory of any of NAND Flash, NOR Flash, and Compact Flash. On chip 1400, a shared memory controller 1426 in circuitry 1420 interfaces the RISC processor 1420 and the DSP 1424 via an on-chip bus to on-chip memory 1440 with RAM and ROM. A 2D graphic accelerator is coupled to frame buffer internal SRAM (static random access memory) in block 1440. A security block 1450 includes an SSM analogous to SSM 1038 of FIG. 1, and includes secure hardware accelerators having security features and provided for secure demand paging 1040 and for accelerating encryption and decryption. A random number generator RNG is provided in security block 1450.

Figure 2:
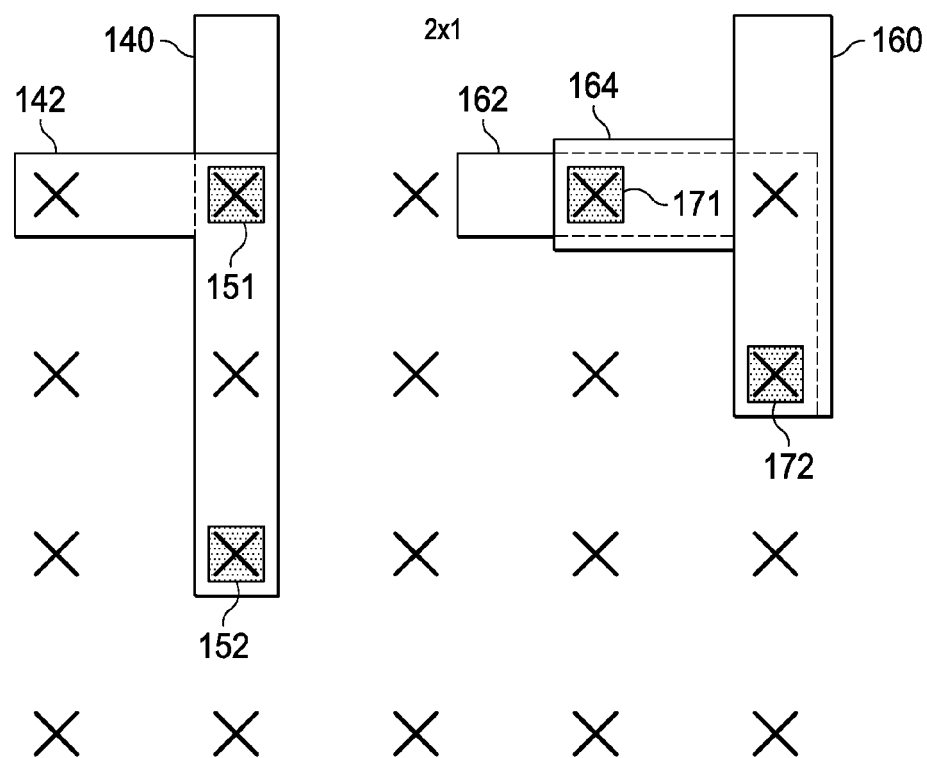
Figure 3:
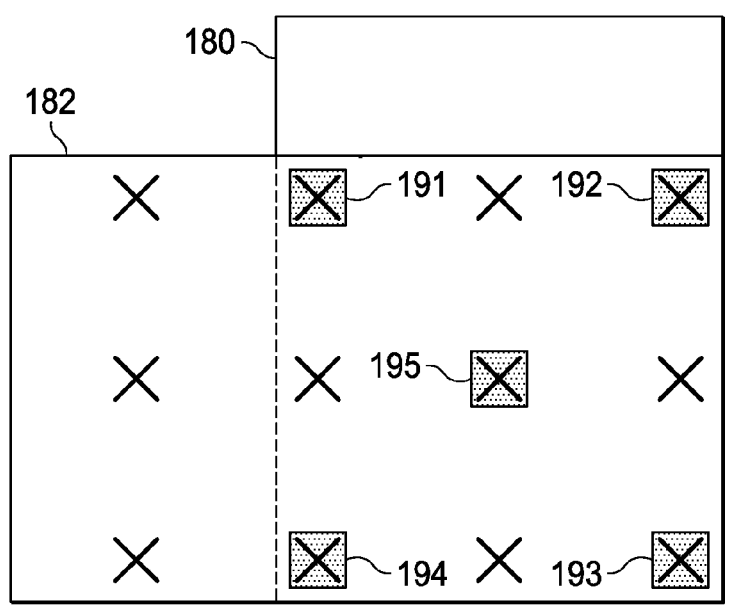
Figure 4:
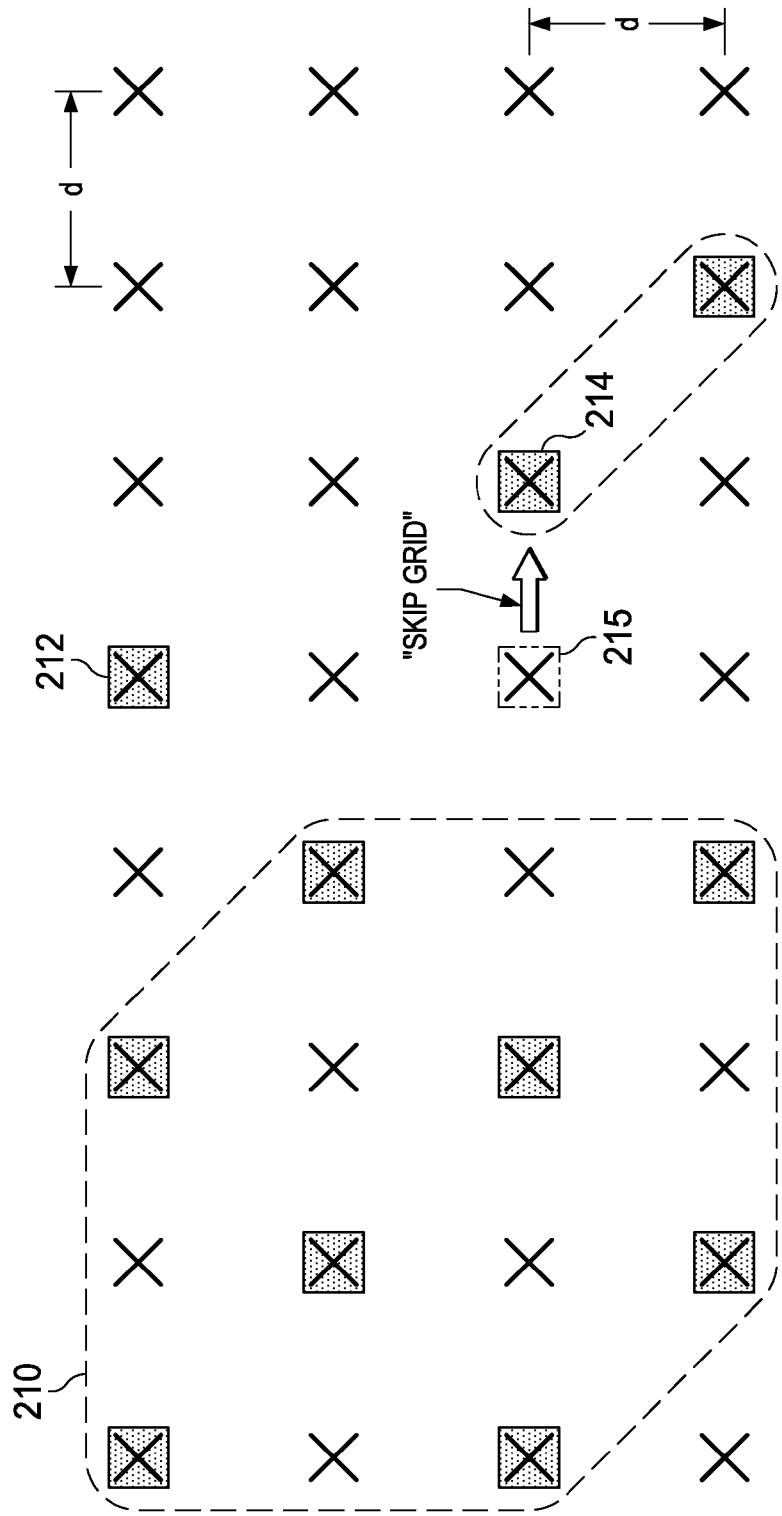
Figure 5A:
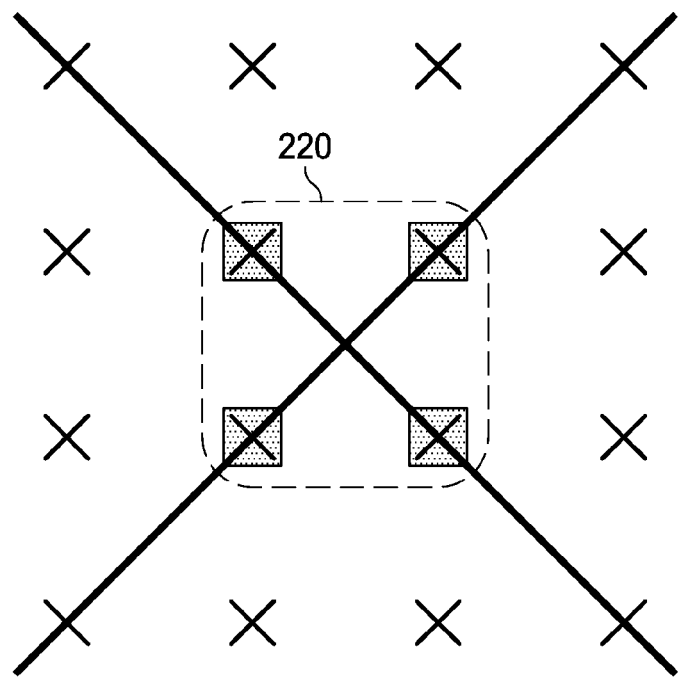
Figure 5B:
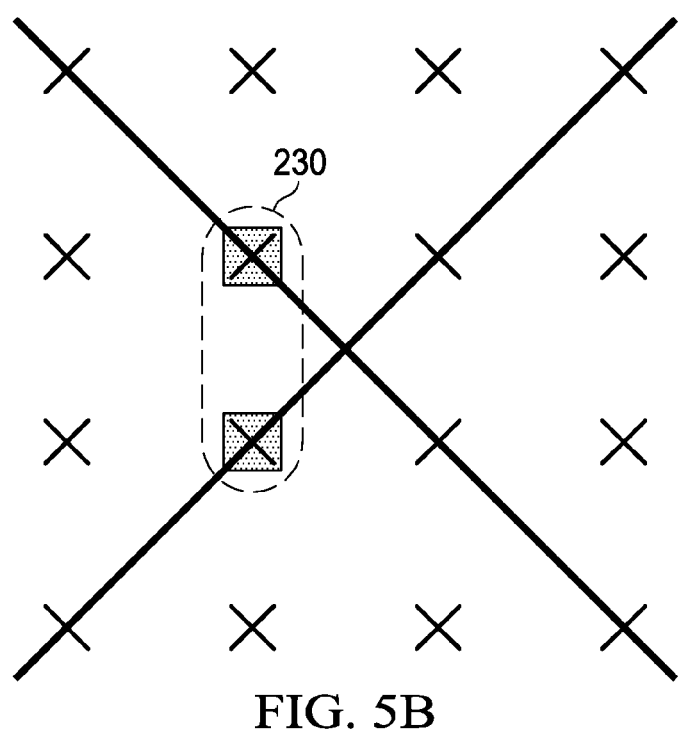

On-chip peripherals and additional interfaces 1410 include UART data interface and MCSI (Multi-Channel Serial Interface) voice wireless interface for an off-chip IEEE 802.15 (Bluetooth and low and high rate piconet and personal network communications) wireless circuit 1430. Debug messaging and serial interfacing are also available through the UART. A JTAG emulation interface couples to an off-chip emulator Debugger for test and debug. GPS 1190 (1495) is scannable by the debugger, see FIG. 2. Further in peripherals 1410 are an I2C interface to analog baseband ABB chip 1200, and an interface to applications interface 1180 of integrated circuit chip 1100 having digital baseband DBB.

Interface 1410 includes a MCSI voice interface, a UART interface for controls and data to position unit GPS 1495 and otherwise, and a multi-channel buffered serial port (McBSP) for data. Timers, interrupt controller, and RTC (real time clock) circuitry are provided in chip 1400. Further in peripherals 1410 are a MicroWire (u-wire 4 channel serial port) and multi-channel buffered serial port (McBSP) to Audio codec, a touch-screen controller (or coupling to 1260), and audio amplifier 1480 to stereo speakers.

External audio content and touch screen (in/out) 1260, 1266 and LCD (liquid crystal display), organic semiconductor display, and DLP™ digital light processor display from Texas Instruments Incorporated, are suitably provided in various embodiments and coupled to interface 1410. In vehicular use, the display is suitably any of these types provided in the vehicle, and sound is provided through loudspeakers, headphones or other audio transducers provided in the vehicle.

An on-chip UART/IrDA (infrared data) interface in interfaces 1410 couples to off-chip GPS (global positioning system of block 1495 cooperating with or instead of GPS 1190) and Fast IrDA infrared wireless communications device. An interface provides EMT9 and Camera interfacing to one or more off-chip still cameras or video cameras 1490, and/or to a CMOS sensor of radiant energy. Such cameras and other apparatus all have additional processing performed with greater speed and efficiency in the cameras and apparatus and in mobile devices coupled to them with improvements as described herein. Further in FIG. 20, an on-chip LCD controller or DLP™ controller and associated PWL (Pulse-Width Light) block in interfaces 1410 are coupled to a color LCD display or DLP™ display and its LCD light controller off-chip and/or DLP™ digital light processor display.

On chip 1400, a power, resets, and control module PRCM 1470 supervises and controls power consuming blocks and sequences them, and coordinates with PRCM 1185 on chip 1100 and with Power Save Mode Controller 2130 (2290) in GPS 1495 as described elsewhere herein.

In FIG. 20, a WLAN integrated circuit 1500 includes MAC (media access controller) 1510, PHY (physical layer) 1520 and AFE (analog front end) 1530 for use in various WLAN and UMA (Unlicensed Mobile Access) modem applications. Interface hardware and internal RAM in WLAN 1500 couples the CPU with interface 1410 of applications processor integrated circuit 1400 thereby providing an additional wireless interface for the system of FIG. 20. In some embodiments, GPS 1495 operates in close coordination with any one, some, or all of WLAN, WiMax, DVB, or other network, to provide positioning, position-based, and user real-time kinematics applications.

Still other additional wireless interfaces such as for wideband wireless such as IEEE 802.16 WiMAX mesh networking and other standards are suitably provided and coupled to the applications processor integrated circuit 1400 and other processors in the system. WiMax has MAC and PHY processes and the illustration of blocks 1510 and 1520 for WLAN indicates the relative positions of the MAC and PHY blocks for WiMax.

Various embodiments are used with one or more microprocessors, each microprocessor having a pipeline is selected from the group consisting of 1) reduced instruction set computing (RISC), 2) digital signal processing (DSP), 3) complex instruction set computing (CISC), 4) superscalar, 5) skewed pipelines, 6) in-order, 7) out-of-order, 8) very long instruction word (VLIW), 9) single instruction multiple data (SIMD), 10) multiple instruction multiple data (MIMD), 11) multiple-core using any one or more of the foregoing, and 12) microcontroller pipelines, control peripherals, and other microcontrol blocks using any one or more of the foregoing.

Various embodiments are implemented in any integrated circuit manufacturing process such as different types of CMOS (complementary metal oxide semiconductor), SOI (silicon on insulator), SiGe (silicon germanium), organic transistors, and with various types of transistors such as single-gate and multiple-gate (MUGFET) field effect transistors, and with single-electron transistors, and other nanoelectronics and other structures. Photonic integrated circuit blocks, components, and interconnects are also suitably applied in various embodiments.

Figure 21:
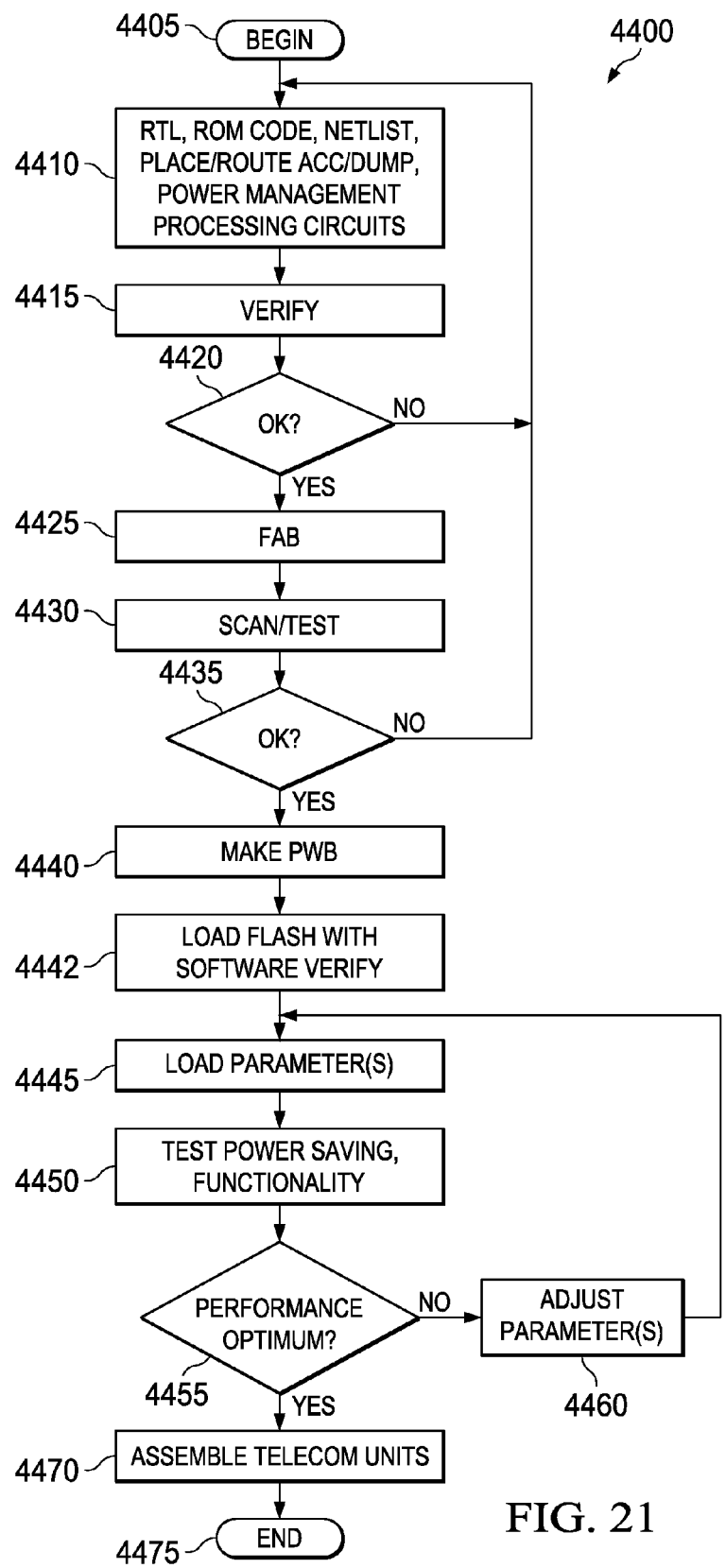
FIG. 21 is a flow diagram of a process embodiment of integrated circuit manufacture utilizing any of the embodiments of structure and process shown in the other Figures.

In FIG. 21, various embodiments of integrated circuit systems and processes as described herein are manufactured according to a suitable process of manufacturing 4400 as illustrated in the flow of FIG. 18. The process begins at step 4405 and a step 4410 prepares RTL (register transfer language) and netlist for a desired embodiment such as one including, or respectively including, an application processor or other integrated circuit. The Figures of drawing show some examples of structures, and the detailed description describes those examples and various other alternatives.

In a step 4415, such embodiment is verified in simulation electronically on the RTL and netlist. Place and route operations are performed to establish the physical layout of each integrated circuit according to embodiments taught herein, and the layout is verified. Then a verification evaluation step 4420 determines whether the verification results are currently satisfactory. If not, operations loop back to step 4410.

If verification evaluation 4420 is satisfactory, the verified design of each integrated circuit is fabricated in a wafer fab and packaged to produce each resulting integrated circuit(s) at step 4425 manufactured according to the verified design(s). Then a step 4430 verifies the operations directly on first-silicon and production samples such as by using scan chain and tracing methodology on the circuits to confirm that actual operation is in accordance with the expected operation of the verified design(s). An evaluation decision step 4435 determines whether the chips are satisfactory, and if not satisfactory, the operations loop back as early in the process as needed such as step 4415 or 4410 to get satisfactory integrated circuits.

In FIG. 21, when the integrated circuits are satisfactory in step 4435, a telecommunications unit based on teachings herein is manufactured. This part of the process prepares in a step 4440 a particular design and printed wiring board (PWB) of a system embodiment using the integrated circuit(s). The particular design of the printed wiring board PWB of FIG. 13 is tested in a step 4440 by electronic simulation and proto-typed and tested in actual application. In a step 4442, software is loaded into flash memory for the system and verified. Operational parameters are loaded in a step 4445 to flash memory 1025 and configure the system. A user interface such as including keypad, map display, and/or microphone of FIG. 20, is coupled to the microprocessor.

The system is powered up in step 4445 and power saving mode parameters and other configuration and operational parameter(s) are boot loaded or run-time loaded in the system in step 4445. A step 4450 tests the running system, decision step 4455 may call for revision or adjustment of the software and/or parameter(s) in a step 4460 until the testing is satisfactory at step 4450 and 4455, whence operations proceed to step 4470 to mass-produce the system. Operations are completed at END 4475.

Numerous geometrical structure alternatives and combinations are also comprehended for conductive wires and other micro-electronic structures in all orientations and dimensions in numerous processes in any applicable materials systems for the wires and any applicable materials systems for each micro-electronic structure. Some embodiments reverse the conductivity type of doped regions as compared with other embodiments. Integrated circuit categories to which the embodiments are applicable include analog ICs, wireless ICs, digital logic ICs and among them memory and microprocessor ICs of any complexity, mixed signal ICs (digital and analog on same chip), mixed photonic and electronic ICs, MEMS (micro-electro-mechanical systems) ICs, digital light processing integrated circuits (e.g., with numerous physically controllable small mirrors, see Texas Instruments U.S. Pat. No. 7,601,624 with via technology all of which is hereby incorporated herein by reference), and all other ICs to which such structures and combination embodiments may be applicable to effectuate any purpose for which they may be useful. These and numerous other embodiments are contemplated wherein they are varied from those shown but otherwise fall within the spirit and scope of the invention and equivalents thereof.

While this invention has been described with reference to illustrative embodiments, this description is not to be construed in a limiting sense. Various modifications and combinations of the illustrative embodiments, as well as other embodiments of the invention may be made. The terms "including", "includes", "having", "has", "with", or variants thereof are used in the detailed description and/or the claims to denote non-exhaustive inclusion in a manner similar to the term "comprising". It is therefore contemplated that the appended claims and their equivalents cover any such embodiments, modifications, and embodiments as fall within the true scope of the invention.

What is claimed is:

1. An integrated circuit structure comprising:
a first conductive layer including a first forked conductive structure, said first forked conductive structure including a pair of first parallel conductor segments, a first transverse conductive portion joining said first parallel conductor segments at a first side of said first transverse conductive portion and a further first conductor segment extending from a second side of said first transverse conductive portion opposite said pair of first parallel conductor segments;
an insulating layer substantially disposed over said first forked conductive structure;
a plurality of conductive vias through said insulating layer and electrically connecting with both of said first parallel conductor segments of said first forked conductive structure; and
a second conductive layer including a second forked conductive structure, said second forked conductive structure including a pair of second parallel conductor segments, a second transverse conductive portion joining said second parallel conductor segments at a first side of said second transverse conductive portion and a further second conductor segment extending from a second side of said second transverse conductive portion opposite said pair of second parallel conductor segments, said second forked conductive structure substantially disposed over at least a portion of said insulating layer and generally perpendicular to said first forked conductive structure, said plurality of conductive vias electrically connecting with both of said second parallel conductor segments of said second forked conductive structure.

2. The integrated circuit structure in 1 wherein said first and second forked conductive structures generally define a central volume between the forks of both of them.

3. The integrated circuit structure in 2 further comprising another conductive via through said insulating layer in that central volume between said pair of first parallel conductor segments and between said pair of second parallel conductor segments and substantially electrically insulated from both said first and second forked conductive structures.

4. The integrated circuit structure in 3 wherein said first conductive layer includes another conductive structure entering said central volume and electrically connecting with said other conductive via and substantially electrically insulated from said first forked conductive structure in the vicinity of said first forked conductive structure.

5. The integrated circuit structure in 4 wherein said second conductive layer includes another conductive structure entering said central volume and electrically connecting with said other conductive via and substantially electrically insulated from said second forked conductive structure in the vicinity of said second forked conductive structure.

6. The integrated circuit structure in 1 wherein said further first conductor segment is wider than each of said first parallel conductor segments.

7. The integrated circuit structure in 1 wherein said further first conductor segment has a width approximately equal to the sum of widths of said first parallel conductor segments.

8. The integrated circuit structure in 1 wherein said further first conductor segment has a width approximately twice as wide as a width of one of said first parallel conductor segments.

9. An integrated circuit structure comprising:
a substrate with at least one transistor;
at least one dielectric layer formed on said substrate;
an interconnect structure having conductor levels above said substrate and formed over the at least one dielectric layer and including contact vias to the transistor, the interconnect structure having at least one level that includes a window-frame-shaped structure situated along at least one wide wire to form at least first and second narrow wires defining an inner edge having a rectangular shape, the interconnect structure having another level with a second wide wire terminating in a fork-shaped conductor that has another first and second narrow wires, and at least four vias electrically connecting said fork-shaped conductor to said window-frame-shaped conductor, a first two of said four vias connecting the first and second narrow wires to at least one of the narrow wires of said fork-shaped conductor and a second two of said four vias connecting the first and second narrow wires to at least the other one of the narrow wires of said fork shaped conductor.

10. The integrated circuit structure claimed in claim 9 wherein said the interconnect structure has a first additional interconnect wire below and approximately parallel to at least one said wide wire and further has a second additional interconnect wire at a level at least as high as the higher of the open window-frame-shaped conductor and the fork-shaped conductor, and a conductive path joining the first and second additional interconnect wires, said conductive path passing through and insulated from the inner edge of said open window-frame-shaped conductor as well as said fork-shaped conductor.

11. The integrated circuit structure claimed in claim 10 wherein said second additional interconnect wire is substantially parallel to the narrow wires of the fork-shaped conductor.

12. The integrated circuit structure claimed in claim 9 wherein the narrow wires of the forkshaped conductor are approximately perpendicular to the narrow wires of the window-frameshaped structure.

13. An integrated circuit structure comprising:
plural levels of metal interconnect and conductive vias variously distributed over at least part of the area thereof as viewed broadside and in conformance with a fixed-grid pattern defining a whole number of a minimum spacing dimension between any two vias, the metal interconnect including first and second wide metal wires each at least approximately as wide as said spacing dimension and respectively situated at least at two different levels, each said wide metal wire branching into at least first and second narrow and substantially parallel wires separated at least two spacing dimensions apart, and at least four vias connecting the narrow wires to each other between the levels, the metal interconnect further including an adjacent route and the narrow wires establishing a porosity occupied by the adjacent route as close as one spacing dimension.

14. The integrated circuit structure claimed in claim 13 further comprising a substrate with transistors formed in a 45 nanometer fabrication process or smaller, said metal interconnect with vias constrained by design rule to such fixed-grid pattern compatible with said fabrication process but achieving low resistance and obviating blockage notwithstanding.

15. The integrated circuit structure claimed in claim 13 wherein the metal interconnect thereby establishes a tuning fork via pattern on a sparse grid admitting such adjacent route.

16. The integrated circuit structure claimed in claim 15 wherein the tuning fork pattern includes such wide wire and narrower tines via-connected tines-to-tines between levels with substantial continuity of resistance relative to the wide wire.

17. The integrated circuit structure claimed in claim 13 wherein the metal interconnect establishes a pattern including a tuning-fork-shape and a window-frame-shape connected by such at least four vias on a grid admitting such adjacent route.

18. An integrated circuit manufacturing process comprising a wafer fabrication process less than 45 nanometers including deposition of plural levels of metal interconnect to establish a pattern including tines-connected tuning forks having a porosity admitting at least one adjacent route.

19. The integrated circuit manufacturing process claimed in claim 18 including depositing conductive vias during the process over at least part of the area of the wafer according to a whole number at least one of a minimum spacing dimension between any two vias, and the depositing of such vias for tines deposition constrained to tines spacing a whole number at least two of the spacing dimension.

20. The integrated circuit manufacturing process claimed in claim 19 including constraining the deposition widths of tuning fork tines to tine widths less than the spacing dimension between vias.

21. The integrated circuit manufacturing process claimed in claim 18 including constraining a wider conductor segment for such tuning fork to a width that is approximately equal to a sum of widths of the tines.

22. The integrated circuit manufacturing process claimed in claim 18 including providing at least two vias per tine to connect tines.

23. An integrated circuit comprising:
an interface;
a processor coupled to said interface; and
a modem-related circuit coupled to said processor, each of said interface, said processor and said modem-related circuit having transistors and at least one of said interface, said processor and said modem-related circuit having its transistors coupled with plural levels of metal interconnect and conductive vias variously distributed over at least part of the area thereof as viewed broadside and in conformance with a fixed-grid pattern defining a whole number of a minimum spacing dimension between any two vias, the metal interconnect including first and second wide metal wires each at least approximately as wide as said spacing dimension and respectively situated at least at two different levels, each said wide metal wire branching into at least first and second narrow and substantially parallel wires separated at least two spacing dimensions apart, and at least four vias connecting the narrow wires to each other between the levels, the metal interconnect further including an adjacent route and the narrow wires establishing a porosity occupied by the adjacent route as close as one spacing dimension.

* * * * *